(12) United States Patent
Hwang et al.

(10) Patent No.: US 6,973,962 B2
(45) Date of Patent: Dec. 13, 2005

(54) RADIATOR WITH AIRFLOW GUIDING STRUCTURE

(75) Inventors: Ching-Bai Hwang, Tu-Cheng (TW); Yi-Chyng Fang, Tu-Cheng (TW); Yeu-Lih Lin, Tu-Cheng (TW)

(73) Assignee: Hon Hai Precision Industry Co., Ltd., (TW)

( * ) Notice: Subject to any disclaimer, the term of this patent is extended or adjusted under 35 U.S.C. 154(b) by 0 days.

(21) Appl. No.: 10/892,641

(22) Filed: Jul. 16, 2004

(65) Prior Publication Data

US 2005/0082034 A1  Apr. 21, 2005

(30) Foreign Application Priority Data

Oct. 17, 2003  (TW) .............................. 92218493 U

(51) Int. Cl.[7] .............................................. F28F 7/00
(52) U.S. Cl. ..................... 165/80.3; 165/121; 361/697; 361/704; 257/706; 257/722; 174/16.3
(58) Field of Search .............................. 165/80.3, 185, 165/121, 122, 104.33, 182

(56) References Cited

U.S. PATENT DOCUMENTS

| | | | | |
|---|---|---|---|---|
| 5,077,601 A | * | 12/1991 | Hatada et al. | 257/722 |
| 5,957,194 A | * | 9/1999 | Azar | 165/80.3 |
| 6,308,771 B1 | * | 10/2001 | Tavassoli | 165/80.3 |
| 6,313,399 B1 | * | 11/2001 | Suntio et al. | 174/17 VA |
| 6,364,009 B1 | * | 4/2002 | MacManus et al. | 165/185 |
| 6,370,025 B1 | * | 4/2002 | Yasufuku et al. | 361/704 |
| 6,498,395 B2 | * | 12/2002 | Baek et al. | 257/722 |
| 6,598,667 B1 | * | 7/2003 | Kuo | 165/80.3 |
| 6,712,130 B2 | * | 3/2004 | Lin | 165/125 |
| 6,802,362 B2 | * | 10/2004 | Wenger et al. | 165/80.3 |
| 6,816,373 B2 | * | 11/2004 | Lee et al. | 361/697 |
| 2002/0174980 A1 | * | 11/2002 | DiBene et al. | 165/185 |
| 2003/0168208 A1 | * | 9/2003 | Sato | 165/122 |
| 2004/0031589 A1 | * | 2/2004 | Lin | 165/80.3 |

FOREIGN PATENT DOCUMENTS

| | | |
|---|---|---|
| TW | 505375 | 10/2002 |
| TW | 516666 | 1/2003 |
| TW | 517932 | 1/2003 |
| TW | 520152 | 2/2003 |

* cited by examiner

Primary Examiner—Terrell Mckinnon
(74) Attorney, Agent, or Firm—Morris Manning & Martin; Tim Tinghang Xia, Esq.

(57) ABSTRACT

A radiator includes a heat transfer base (30), a heat dissipation member (20) secured to the heat transfer base and a fan (50) mounted to the heat dissipation member. The heat dissipation member comprises a plurality of fins (22) for dissipation heat. Air guide structures are formed between the fins for guiding air from the fan to a middle portion of the heat transfer base and a middle bottom portion of the heat dissipation member in order to enhance heat dissipating efficiency of the radiator.

11 Claims, 3 Drawing Sheets

RADIATOR WITH AIRFLOW GUIDING STRUCTURE

BACKGROUND OF THE INVENTION

1. Field of the Invention

The present invention relates to radiators for removing heat from electronic components, and more particularly to a radiator having an airflow guiding structure.

2. Description of Related Art

During operating of an electronic component such as a computer middle processing unit (CPU), a large amount of heat is often generated. The heat must be quickly removed from the CPU to prevent it from becoming unstable or unexpectedly. Typically, a heat sink is attached to an outer surface of the CPU to facilitate removal of heat therefrom. A fan is mounted on top of the heat sink to enhance heat dissipation efficiency.

Taiwan Patent Issue No. 520152 shows a radiator having a heat sink and a fan mounted on the heat sink. The radiator comprises a flat base for contacting a surface of an electronic component, a plurality of fins extending perpendicularly from the base for radiating heat to the ambient air. The fan is mounted above the fins for providing enforced air convection within channels defined between the fins. Typically, the electronic component is smaller than the base of the heat sink and is thermally contacted by a middle portion of the base of the heat sink. During operation of the radiator, the base absorbs heat generated by the electronic component, with the middle portion thereof having the highest temperature. Heat on the base is then transferred to the fins for dissipation. Fresh air driven by the fan flows in channels between the fins to exchange heat therewith. However, airflow in inner sections of the channels of the heat sink is weaker than the airflow in outer sections of the channels. As a result, air in the inner sections flows slowly and heat accumulated on the middle portion of the base and fins adjacent the middle portion of the base is arduously taken away from the fins. Heat exchange efficiency between fresh air and the middle portion of the base, fins adjacent the middle portion of the base is very low. It occurs that there is a slowest speed of heat exchange between air and a portion of the heat sink having the highest temperature. Apparently, this kind of radiator is inefficient for removing heat from the electronic component to be cooled.

SUMMARY OF THE INVENTION

Accordingly, an object of the present invention is to provide a radiator having improved airflow path therein for efficient heat radiation.

In order to achieve the object set out above, a radiator in accordance with a preferred embodiment of the present invention comprises a heat transfer base, a heat dissipation member secured onto the heat transfer base and a fan mounted onto the heat dissipation member. The heat dissipation member comprises a plurality of fins for dissipation heat. Air guide structures are formed between the fins for guiding air from the fan to a middle portion of the heat transfer base and a middle bottom portion of the heat dissipation member in order to enhance heat dissipating efficiency of the radiator.

Other objects, advantages and novel features of the present invention will become more apparent from the following detailed description when taken in conjunction with the accompanying drawings, in which:

DETAILED DESCRIPTION OF THE INVENTION

Figure 1:
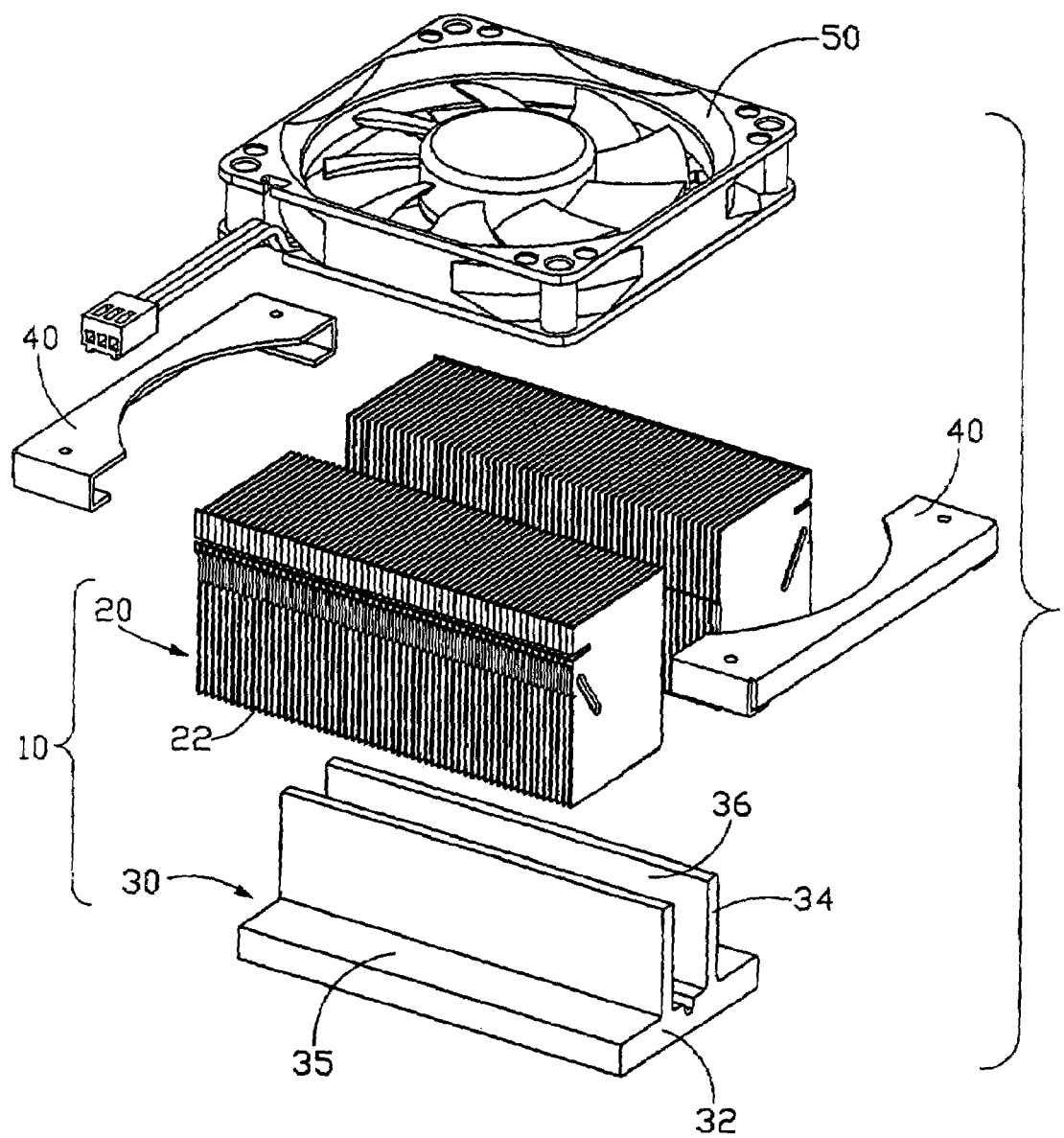
FIG. 1 is an exploded, isometric view of a radiator in accordance with the preferred embodiment of the present invention.

Referring to FIG. 1, a radiator in accordance with the preferred embodiment of the present invention comprises is provided to remove heat from an electronic component (not shown), such as a middle processing unit (CPU). The radiator comprises a heat sink 10 and a fan 50. The heat sink 10 comprises a heat transfer base 30 and a heat dissipation member 20 having a plurality of fins 22. The fan 50 is mounted on the heat dissipation member 20 via a pair of fan holders 40.

The heat transfer base 30 comprises a support plate 32 and a pair of separated and parallel engaging plates 34 integrally, longitudinally formed on the support plate 32. The support plate 32 has its first surface contact the CPU and forms a pair of shoulders 35 on an opposite surface. The engaging plates 34 are interposed between the shoulders 35 and respectively connectively relates with the shoulders 35. The engaging plates 34 are spaced from one another and thus define a channel 36 therebetween for receiving a clip (not shown).

Figure 2:
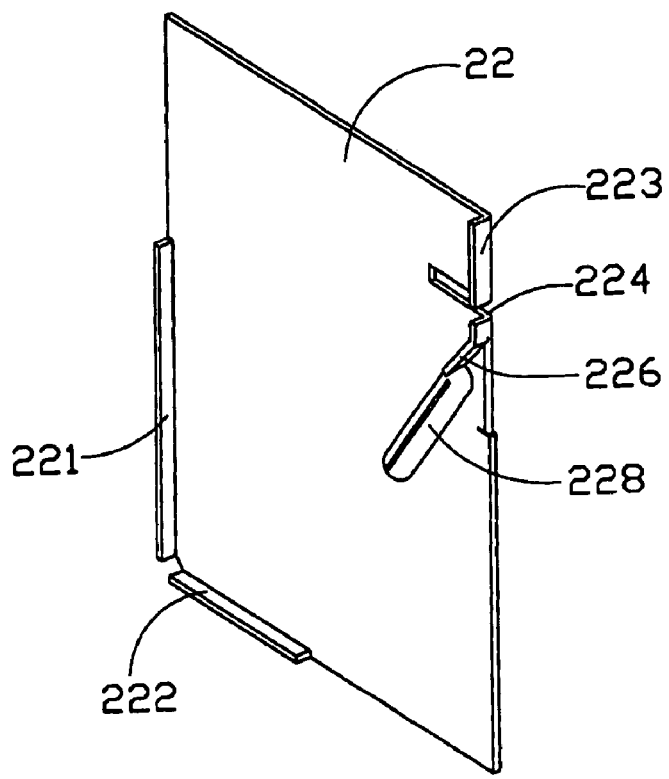
FIG. 2 is a view of a fin of the radiator of FIG. 1.
Figure 3:
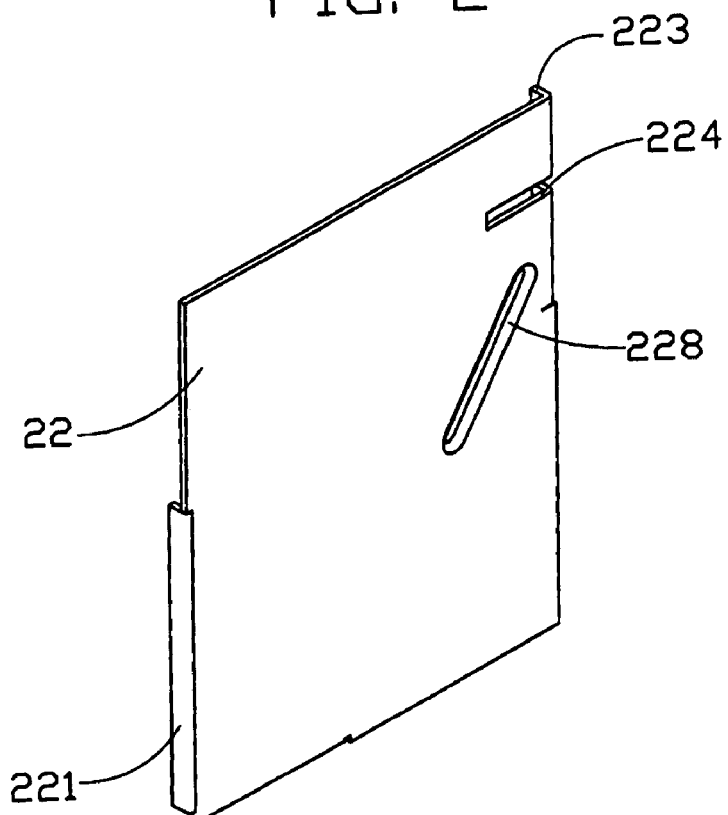
FIG. 3 is another view of the fin of FIG. 2.
Figure 4:
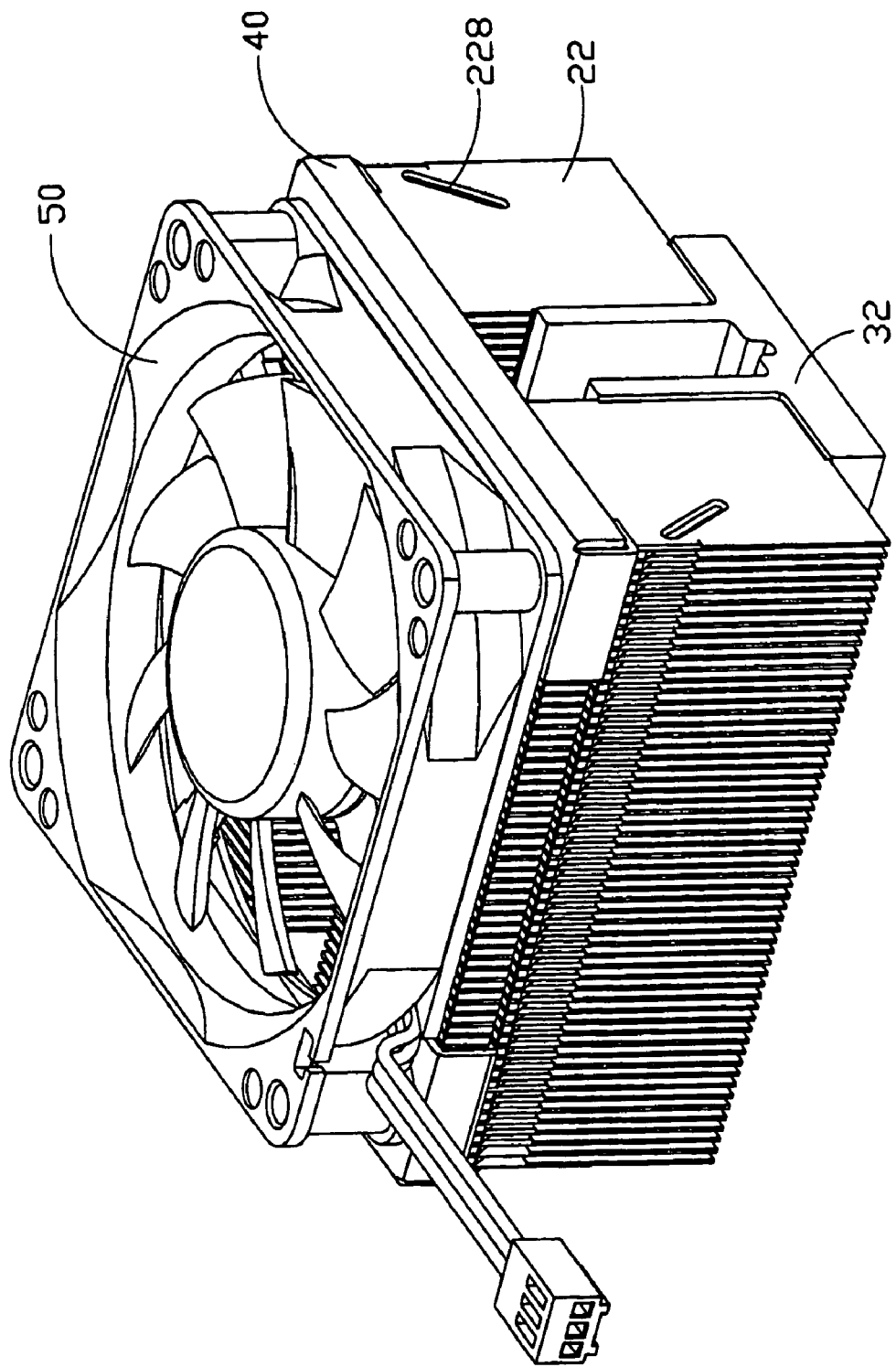
FIG. 4 is an assembled view of the radiator of FIG. 1.

Referring to FIGS. 2–3, each fin 22 has a substantially rectangular configuration. The fin 22 forms a flange 221 at an edge thereof, facing a corresponding engaging plate 34 and having a length equal to a height of the engaging plate 34. The fin 22 further forms a rim 222 at an adjacent edge facing a corresponding shoulder 35 having a length equal to a width of the shoulder 35. The fin additionally forms a lip 223 at an edge parallel to the flange 221 and distal from the rim 222. The flange 221, the rim 222 and the lip 223 are disposed at a same side of the fin 22. A cutout 224 is defined in the lip 223 and expanded in the fin 22. An air guide structure is formed on the fin 22 below the cutout 224. In FIG. 2, the air guide structure comprises a tab 226 extending from and angled with the lip 223, an elongated protrusion 228 stamped from the fin 22, aligned with the tab 226 and further substantially directed to the corner between the flange 221 and the rim 222.

In assembly of the radiator, the flanges 221 and the rims 222 of the fins 22 are respectively secured to the engaging plates 34 and the shoulders 35 via bond or solder, thus the heat dissipation member 20 is firmly mounted to the heat transfer base 10. The flanges 221, the rims 222 and the lips 223 respectively or cooperatively determine the distance between the fins 22. The air guide structures are disposed between the fins 22. The fan holder 40 is engaged in the cutouts 224 of the fins 22. The fan 50 is mounted to the fan holder 40 to guide exterior air in the radiator. The air entered from the fan 50 conflicts with the air guide structure and change flow direction along the air guide structure to the highest temperature portion of the radiator, i.e. a middle top portion of the heat transfer base 30 or/and a middle bottom portion of the heat dissipation member 20.

There of course has a plurality of modifications to the air guide structure, such as: a tab having a longer length than the tab 226 of the embodiment can be provided to replace the air guide structure of the preferred embodiment; a plate dividually from the heat dissipation member 20 and extending through the fins 22 at the position where the protrusion 228 is formed in the preferred embodiment, can also form an air guide structure between the fins 22. Additionally, the elongated protrusions 228 of the preferred embodiment can be replaced by a plurality of linearly arranged dotted protrusions.

It is to be understood, however, that even though numerous characteristics and advantages of the present invention have been set forth in the foregoing description, together with details of the structure and function of the invention, the disclosure is illustrative only, and changes may be made, for example, the fins 22 of the heat dissipation member 20 can be connected at upper portions above the engaging plates 34 and the channel 36.

What is claimed is:

1. A radiator comprising:
   a heat dissipation member comprising a plurality of fins extending from one end to an opposite end of the heat dissipation member, air guide structures directed to a middle portion of said one end being formed between the fins and between said ends;
   a fan mounted on the heat dissipation member at said opposite end, and
   a rectangular heat transfer base to which the heat dissipation member is attached;
   wherein the heat dissipation member comprises a pair of fin sub-assemblies juxtapose to each other, and
   wherein the heat transfer base comprises a pair of parallel engaging plates interposed between said fin sub-assemblies.

2. The radiator of claim 1, wherein the air guide structures are a plurality of elongated protrusions stamped from the fins.

3. The radiator of claim 1, wherein the air guide structure comprise a plurality of elongated tabs bent from the fins.

4. The radiator of claim 1, wherein a channel is defined between the engaging plates.

5. A radiator comprising:
   a heat transfer base;
   a fan; and
   a plurality of fins extending between the heat transfer base and the fan, a plurality of air guide structures being formed between the fins for directing air from the fan to a middle portion of the heat transfer base,
   wherein the heat transfer base has a pair of engaging plates between the fins, and a channel is defined between the engaging plates.

6. The radiator of claim 5, wherein the fan is mounted to the fins via a pair of fan holders.

7. The radiator of claim 5, wherein each of the fins forms a rim contacting a top surface of the heat transfer base.

8. The radiator of claim 5, wherein each of the fins forms a flange contacting an outer surface of the engaging plates.

9. A radiator comprising:
   a heat dissipation member comprising a plurality of fins, at least one of the fins defining opposite side edges;
   a rim being formed at said fin adjacent one of said opposite side edges;
   a guide structure being formed at the fin adjacent the other of said opposite side edges and directed to the rim, and
   a heat transfer base, the rim contacting the heat transfer base,
   wherein the heat transfer base comprises an engaging plate, a flange being formed at said one of said opposite side edges and contacting the engaging plate.

10. The radiator of claim 9, wherein the heat dissipation member comprises a pair of fin sub-assemblies juxtaposed to each other, and the heat transfer base further comprises another engaging plate the engaging plates being interposed between said fin sub-assemblies.

11. The radiator of claim 9, wherein the guide structure comprises elongated tab and protrusion aligned with each other and extending from said fin.

* * * * *